(12) United States Patent
Steffan et al.

(10) Patent No.: US 6,875,560 B1
(45) Date of Patent: Apr. 5, 2005

(54) TESTING MULTIPLE LEVELS IN INTEGRATED CIRCUIT TECHNOLOGY DEVELOPMENT

(75) Inventors: Paul J. Steffan, Elk Grove, CA (US); Jeffrey P. Erhardt, San Jose, CA (US); Shivananda S. Shetty, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/632,471

(22) Filed: Aug. 1, 2003

(51) Int. Cl.$^7$ .................................................. G03C 5/00
(52) U.S. Cl. ...................................... 430/315; 430/313
(58) Field of Search ................................. 430/313, 315

(56) References Cited

U.S. PATENT DOCUMENTS 5,629,137 A * 5/1997 Leedy ........................ 430/313
5,654,127 A * 8/1997 Leedy ........................ 430/315

* cited by examiner

Primary Examiner—John F. Niebling
Assistant Examiner—Andre' C. Stevenson
(74) Attorney, Agent, or Firm—Mikio Ishimaru

(57) ABSTRACT

A method of testing an integrated circuit is provided, which includes providing a semiconductor substrate having a semiconductor device provided thereon. A first dielectric layer is formed over the semiconductor substrate and a first channel is formed in the first dielectric layer in contact with the semiconductor device. A first contact pad mask layer is formed and a first contact pad in the first contact pad mask layer is formed in contact with the first channel. The first contact pad is used to test the first channel and the semiconductor device and the first contact pad mask layer and the first contact pad are removed.

20 Claims, 3 Drawing Sheets

US 6,875,560 B1

TESTING MULTIPLE LEVELS IN INTEGRATED CIRCUIT TECHNOLOGY DEVELOPMENT

BACKGROUND

TECHNICAL FIELD

The present invention relates generally to semiconductor technology and more specifically to semiconductor research and development.

BACKGROUND ART

Today, electronic products are used in almost every aspect of life, and the heart of these electronic products is the integrated circuit. Integrated circuits are used in everything from cell phones to automotive displays to airplane controls.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

The ideal would be to have every one of the integrated circuits on a wafer functional and within specifications, but because of the sheer numbers of processes and minute variations in the processes, this rarely occurs. "Yield" is the measure of how many "good" integrated circuits there are on a wafer divided by the total number of integrated circuits formed on the wafer divided by the maximum number of possible good integrated circuits on the wafer. A 100% yield is extremely difficult to obtain because minor variations, due to such factors as timing, temperature, and materials, substantially affect a process. Further, one process often affects a number of other processes, often in unpredictable ways.

In a manufacturing environment, the primary purpose of experimentation is to increase the yield. Experiments are performed in-line and at the end of the production line with both production wafers and experimental wafers. However, yield enhancement methodologies in the manufacturing environment produce an abundance of very detailed data for a large number of wafers on processes subject only to minor variations. Major variations in the processes are not possible because of the time and cost of using production equipment and production wafers. Setup times for equipment and processing time can range from weeks to months, and processed wafers can each contain hundreds of thousands of dollars worth of integrated circuits.

The learning cycle for the improvement of systems and processes requires coming up with an idea, formulating a test(s) of the idea, testing the idea to obtain data, studying the data to determine the correctness of the idea, and developing new ideas based on the correctness of the first idea. The faster the correctness of ideas can be determined, the faster new ideas can be developed. Unfortunately, the manufacturing environment provides a slow learning cycle because of manufacturing time and cost.

Recently, the great increase in the complexity of integrated circuit manufacturing processes and the decrease in time between new product conception and market introduction have both created the need for speeding up the learning cycle.

This has been accomplished in part by the unique development of the integrated circuit research and development environment. In this environment, the learning cycle has been greatly speeded up and innovative techniques have been developed that have been extrapolated to high volume manufacturing facilities.

To speed up the learning cycle, processes are speeded up and major variations are made to many processes, but only a few wafers are processed to reduce cost. The research and development environment has resulted in the generation of tremendous amounts of data and analysis for all the different processes and variations. This, in turn, has required a large number of engineers to do the analysis. With more data, the answer always has been to hire more engineers.

However, this is not an acceptable solution for major problems.

The problems include, but are not limited to, the difficulty of testing an integrated circuit during the various intermediate stages of manufacturing, and in particular the semiconductor device and the wiring elements as they are manufactured.

Solutions to these problems have been long sought but prior developments have not taught or suggested any solutions and, thus, solutions to these problems have long eluded those skilled in the art.

DISCLOSURE OF THE INVENTION

The present invention provides a method of testing an integrated circuit, which includes providing a semiconductor substrate having a semiconductor device provided thereon. A first dielectric layer is formed over the semiconductor substrate and a first channel is formed in the first dielectric layer in contact with the semiconductor device. A first contact pad mask layer is formed and a first contact pad in the first contact pad mask layer is formed in contact with the first channel. The first contact pad is used to test the first channel and the semiconductor device and the first contact pad mask layer and the first contact pad are removed. The method allows easy testing an integrated circuit during the various intermediate stages of manufacturing, and in particular the semiconductor device and the wiring elements as they are manufactured.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
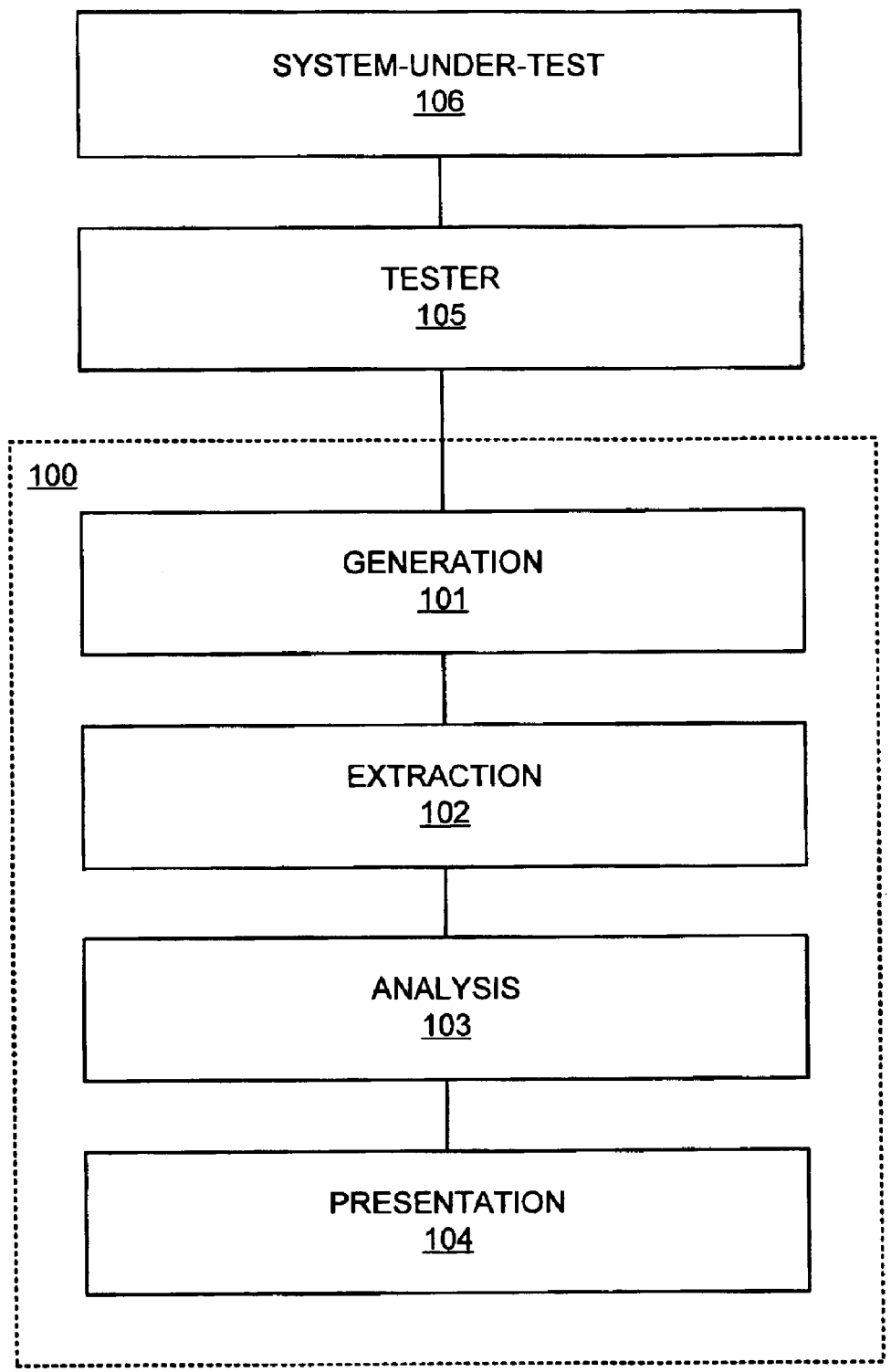
FIG. 1 is a block diagram of a tester information processing system according to the present invention.

Referring now to FIG. 1, therein is shown a block diagram of a tester information processing system 100 according to the present invention. The tester information processing system 100 is the result of the discovery that at times a single fundamental block can solve the problems presented but often there are four fundamental blocks to solving the problems presented.

The four fundamental blocks are a generation block 101, an extraction block 102, an analysis block 103, and a presentation block 104. Each of the blocks can stand independently in the tester information processing system 100, and within these blocks are various commercially available techniques, methodologies, processes, and approaches as well as the invention disclosed herein. The four fundamental blocks are discussed in the approximate chronology that the blocks are used in the tester information processing system 100.

The tester information processing system 100 includes various pieces of commercially available production, test, research, and development semiconductor equipment, which operate on and manipulate information and/or data, which are generically defined herein as "information". The tester information processing system receives information from a tester 105, which is connected to a system-under-test 106.

In the integrated circuit field, the tester 105 can be a semiconductor test system for testing wafers or die and the system-under-test 10 can be anything from a complete wafer down to an element of an individual semiconductor device on a die.

In the generation block 101, basic information is generated looking at new and old products, new and old processes, product and process problems, unexpected or unpredictable results and variations, etc. Generation of the information may use the tester 105 itself, a conventional test information, a personal computer, etc. It may also require new equipment and/or methods, which are described herein when required.

In the extraction block 102, usable information is extracted from the generated information from the generation block 101. Essentially, the generated information is translated into more useful forms; e.g., broken apart so it can be reassembled in different forms to show different interrelationships.

For example, most testing equipment provides raw data in massive test files. Sometimes, millions of measurements provide millions of pieces of information, which must be digested and understood. The test files seldom have a user-friendly tabular output of parameter and value. Even where somewhat user-friendly outputs are provided, there are problems with the proper schema for storing the usable data and for formatting the data for subsequent analysis.

Extraction of the usable information may also require new equipment and/or methods. Sometimes, extraction includes storing the information for long duration experiments or for different experiments, which are described herein when required.

In the analysis block 103, the usable information from the extraction block 102 is analyzed. Unlike previous systems where a few experiments were performed and/or a relatively few data points determined, the sheer volume of experiments and data precludes easy analysis of trends in the data or the ability to make predictions based on the data. Analysis of the extracted information may also require new equipment and/or methods, which are described herein when required.

In the presentation block 104, the analyzed information from the analysis block 103 is manipulated and presented in a comprehensible form to assist others in understanding the significance of the analyzed data. The huge amount of analyzed information often leads to esoteric presentations, which are not useful per se, misleading, or boring. Proper presentation often is an essential ingredient for making informed decisions on how to proceed to achieve yield and processing improvements. In some cases, problems cannot even be recognized unless the information is presented in an easily understood and digested form, and this often requires new methods of presentation, which are described herein when required.

Figure 2:
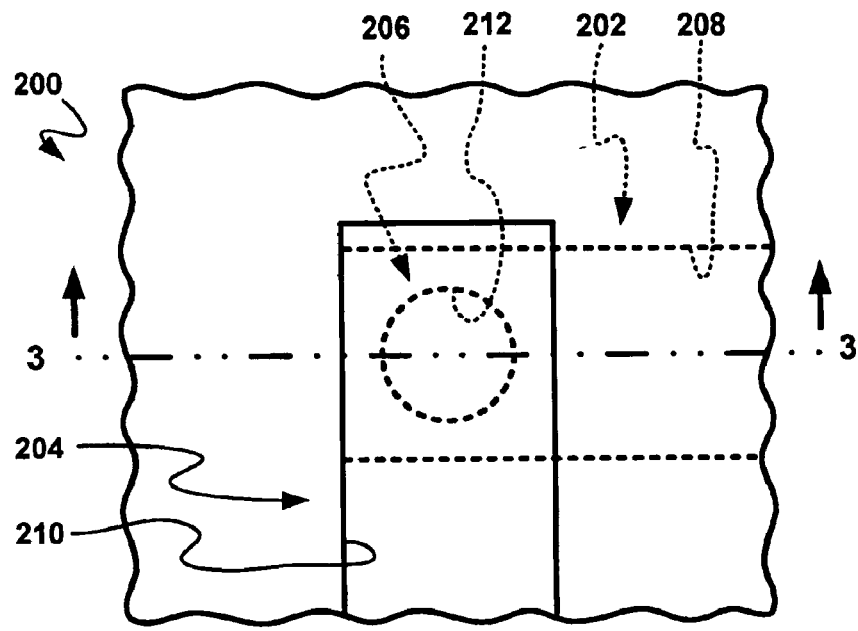
FIG. 2 is a plan view of a tested integrated circuit during manufacturing.

Referring now to FIG. 2, therein is shown a plan view of a tested integrated circuit 200 during manufacturing. The integrated circuit includes a silicon semiconductor substrate (not shown) having, as interconnects, first and second channels 202 and 204 connected by a via 206. The first and second channels 202 and 204 are respectively disposed in first and second channel dielectric layers 208 and 210. The via 206 is an integral part of the second channel 204 and is disposed in a via dielectric layer 212.

The term "horizontal" as used in herein is defined as a plane parallel to the conventional plane or surface of a wafer or substrate, regardless of its orientation. The term "vertical" refers to a direction perpendicular to the horizontal as just defined. Terms, such as "on", "above", "below", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Figure 3:
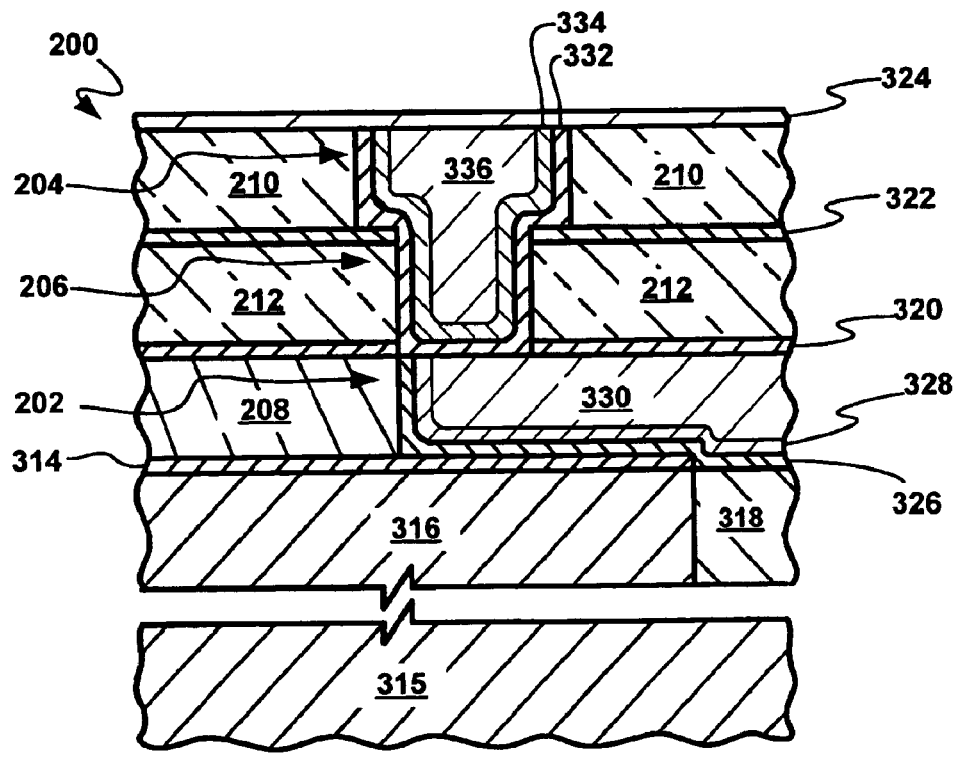
FIG. 3 is a cross-section of FIG. 2 along line 3—3.

Referring now to FIG. 3, therein is shown a cross-section of FIG. 2 along line 3—3. A portion of the first channel 202 is disposed in a first channel stop layer 314 and is over a device dielectric layer 316, which is over a silicon semiconductor substrate 315. Generally, metal contacts are formed in the device dielectric layer 316 to connect to an operative semiconductor device (represented by a semiconductor contact 318) on the semiconductor substrate 315. The first channel 202 is in contact with a semiconductor contact 318 embedded in the device dielectric layer 316. The various layers above the device dielectric layer 316 are sequentially: the first channel stop layer 314, the first channel dielectric layer 208, a via stop layer 320, the via dielectric layer 212, a second channel stop layer 322, the second channel dielectric layer 210, and a capping or via stop layer 324.

The first channel 202 includes a barrier layer 326, which could optionally be a combined adhesion and barrier layer, and a seed layer 328 around a conductor core 330. The second channel 204 and the via 206 include a barrier layer 332, which could also optionally be a combined adhesion and barrier layer, and a seed layer 334 around a conductor core 336. The barrier layers 326 and 332 are used to prevent diffusion of the conductor materials into the adjacent areas of the semiconductor device. The seed layers 328 and 334 form electrodes on which the conductor material of the conductor cores 330 and 336 is deposited. The seed layers 328 and 334 are of substantially the same conductor material as the conductor cores 330 and 336 and become part of the respective conductor cores 330 and 336 after the deposition.

In various embodiments, the diffusion barrier layers are of materials such as tantalum (Ta), titanium (Ti), tungsten (W), alloys thereof, and compounds thereof. The seed layers (where used) are of materials such as copper (Cu), gold (Au), silver (Ag), alloys thereof, and compounds thereof with one or more of the above elements. The conductor cores with or without seed layers are of conductor materials such as copper, aluminum (Al), gold, silver, alloys thereof, and compounds thereof. Similarly, the contact pads are of conductor materials such as copper, aluminum, gold, silver, alloys thereof, and compounds thereof.

The dielectric layers are of dielectric materials such as silicon oxide ($SiO_x$), tetraethylorthosilicate (TEOS), borophosphosilicate (BPSG) glass, etc. with dielectric constants from 4.2 to 3.9 or low dielectric constant dielectric materials such as fluorinated tetraethylorthosilicate (FTEOS), hydrogen silsesquioxane (HSQ), bis-benzocyclobutene (BCB), TMOS (tetramethylorthosilicate), OMCTS (octamethyleyclotetrasiloxane), HMDS (hexamethyldisiloxane), SOB (trimethylsilil borxle), DADBS (diaceloxyditerliarybutosiloxane), SOP (trimethylsilil phosphate), etc. with dielectric constants below 3.9 to 2.5. Ultra-low dielectric constant dielectric materials, having dielectric constants below 2.5 and which are available include commercially available Teflon-AF, Teflon microemulsion, polimide nanofoams, silica aerogels, silica xerogels, and mesoporous silica.

The stop layers and capping layers (where used) are of materials such as silicon nitride ($Si_xN_x$) or silicon oxynitride (SiON).

Figure 4:
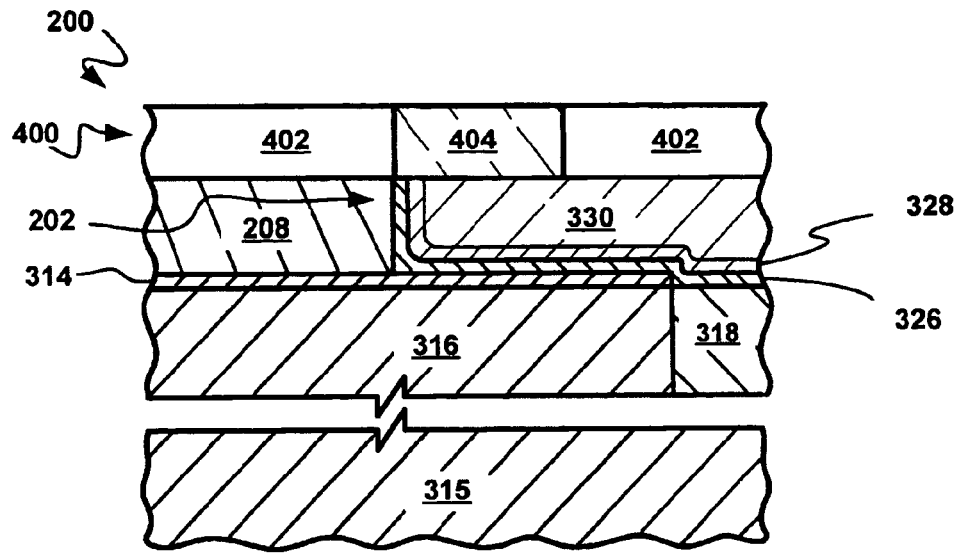
FIG. 4 is the structure of FIG. 3 in an intermediate stage of manufacturing.

Referring now to FIG. 4, therein is shown the structure of FIG. 3 in an intermediate stage of manufacturing. The portion of the first channel 202 is disposed in the first channel stop layer 314 and is over the device dielectric layer 316, which is over the silicon semiconductor substrate 315. The metal contact 318 is formed in the device dielectric layer 316 to the semiconductor device (represented by the metal contact 318) on the semiconductor substrate 315. The first channel 202 is in contact with a semiconductor contact 318 embedded in the device dielectric layer 316. The remaining portion of the first channel 202 is in the first channel dielectric layer 208.

To run a first test on the semiconductor, the metal contact 318, and the channel 330, a removable mask/contact layer 400 has been formed. The removable mask/contact layer 400 includes a photoresist, which is deposited on the first channel dielectric layer 208 and which is patterned to form a contact pad mask layer 402. The contact pad mask layer 402 has an opening for deposition of a contact pad 404.

The contact pad 404 may be of any size but is preferably sized to allow contact by a microprobe from the tester 105 through which data can be generated in the generation block 101 and the extraction block 102, all shown in FIG. 1.

After the testing is performed, a simple removal process, such as chemical mechanical polishing, can be used to remove the removable mask/contact layer 400 and continue the process of completing the integrated circuit 200.

Since the formation of the removable mask/contact layer 400 uses conventional processes, the formation and testing integrates easily into the manufacturing process and allows multi-level testing; e.g., testing at each level of the conductive elements at each dielectric layer.

It will be apparent to those skilled in the art from the above disclosure that it is possible to have a conventional process flow for manufacturing the integrated circuit 200 but that testing may be performed at multiple levels of manufacturing the interconnect of the channels and vias by the use of the removable mask/contact layer 400. For example, by reference to FIG. 3, it is apparent that the removable mask/contact layer 400 can be used for testing of the semiconductor device, the contact 318, the first channel 202, and the via 206 and the second channel 204 by depositing the removable mask/contact layer 400 before depositing the via stop layer 324.

Additional single and dual damascene layers of channels and contacts may be similarly tested.

Figure 5:
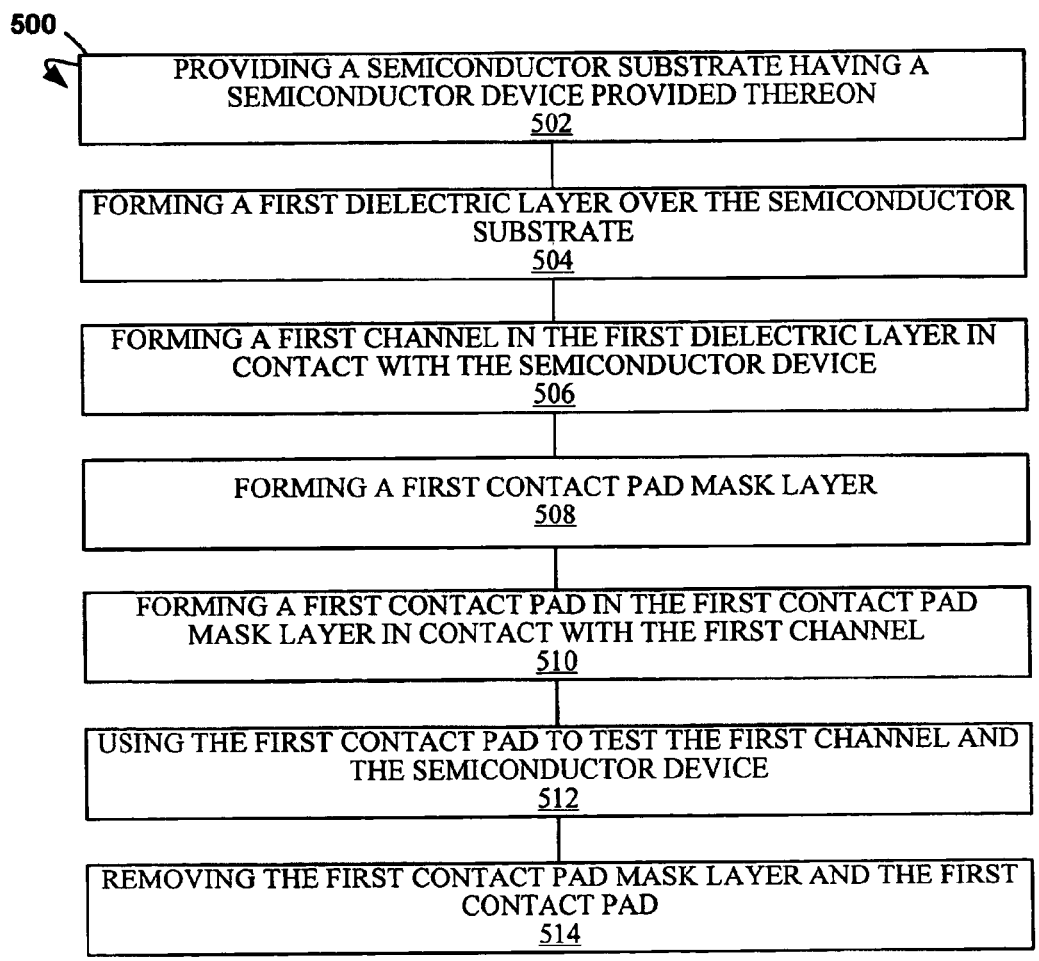
FIG. 5 is a method of testing the integrated circuit of FIG. 2 in accordance with the present invention.

Referring now to FIG. 5, therein is shown a method 500 of testing the integrated circuit 200 of FIG. 2 in accordance with the present invention. The method 500 includes: providing a semiconductor substrate having a semiconductor device provided thereon in a block 502; forming a first dielectric layer over the semiconductor substrate in a block 504; forming a first channel in the first dielectric layer in contact with the semiconductor device in a block 506; forming a first contact pad mask layer in a block 508; forming a first contact pad in the first contact pad mask layer in contact with the first channel in a block 510; using the first contact pad to test the first channel and the semiconductor device in a block 512; and removing the first contact pad mask layer and the first contact pad in a block 514.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of testing an integrated circuit comprising:

providing a semiconductor substrate having a semiconductor device provided thereon;

forming a first dielectric layer over the semiconductor substrate;

forming a first channel in the first dielectric layer in contact with the semiconductor device;

forming a first contact pad mask layer;

forming a first contact pad in the first contact pad mask layer in contact with the first channel;

using the first contact pad to test the first channel and the semiconductor device;

removing the first contact pad mask layer and the first contact pad;

forming a second dielectric layer over the semiconductor substrate;

forming a second channel in the second dielectric layer in contact with the semiconductor device;

forming a second contact pad mask layer; and forming a second contact pad in the second contact pad mask layer in contact with the channel.

2. The method as claimed in claim 1 additionally comprising:

using a tester having a microprobe; and wherein:

using the first contact pad includes forming the first contact pad for contact by the microprobe.

3. The method as claimed in claim 1 additionally comprising:

forming the first contact pad mask layer uses a photoresist.

4. The method as claimed in claim 1 additionally comprising:

forming the first contact pad forms a material selected from a group consisting of copper, aluminum, gold, silver, a compound thereof, and a combination thereof.

5. The method as claimed in claim 1 wherein:

removing the first contact pad mask layer and the first contact pad uses polishing.

6. The method as claimed in claim 1 additionally comprising:

using the second contact pad to test the second channel; and removing the second contact pad mask layer and the second contact pad.

7. The method as claimed in claim 6 additionally comprising:

using a tester having a microprobe; and wherein:

using the second contact pad includes forming the second contact pad for contact by the microprobe.

8. The method as claimed in claim 6 additionally comprising:

forming the second contact pad mask layer uses a photoresist.

9. The method as claimed in claim 6 additionally comprising:

forming the second contact pad uses a material selected from a group consisting of copper, aluminum, gold, silver, a compound thereof, and a combination thereof.

10. The method as claimed in claim 6 wherein:

removing the second contact pad mask layer and the second contact pad uses polishing.

11. The method as claimed in claim 1 additionally comprising:

forming a via dielectric layer over the semiconductor substrate;

forming a via in the via dielectric layer in contact with the semiconductor device;

forming a second dielectric layer over the via dielectric layer;

forming a second channel in the second dielectric layer contiguous with the via;

forming a second contact pad mask layer;

forming a second contact pad in the second contact pad mask layer in contact with the second channel;

using the second contact pad to test the via and second channel; and removing the second contact pad mask layer and the second contact pad.

12. The method as claimed in claim 11 additionally comprising:

using a tester having a microprobe; and wherein:

using the second contact pad includes forming the second contact pad for contact by the microprobe.

13. The method as claimed in claim 11 additionally comprising:

forming the second contact pad mask layer uses a photoresist.

14. The method as claimed in claim 11 additionally comprising:

forming the second contact pad forms a material selected from a group consisting of copper, aluminum, gold, silver, a compound thereof, and a combination thereof.

15. The method as claimed in claim 11 wherein:

removing the second contact pad mask layer and the second contact pad uses polishing.

16. A method of testing an integrated circuit comprising:

providing a semiconductor substrate having a semiconductor device provided thereon;

forming a device dielectric layer over the semiconductor substrate by deposition;

forming a first dielectric layer over the device dielectric layer by deposition;

forming a contact to the semiconductor device in the device dielectric layer;

forming a first channel in the first dielectric layer in contact with the contact;

forming a via dielectric layer over the first dielectric layer;

forming a via in the via dielectric layer in contact with the first channel;

forming a second dielectric layer over the via dielectric layer;

forming a second channel in the second dielectric layer contiguous with the via;

forming a contact pad mask layer over a layer selected from the group consisting of the first dielectric layer, the via layer, the second dielectric layer, and a combination thereof;

forming a contact pad in the contact pad mask layer in contact with an element selected from a group consisting of the first channel, the via, the second channel, and a combination thereof;

using the contact pad to test an element from a group consisting of the semiconductor device, the contact, the first channel, the via, the second channel, and a combination thereof; and removing the contact pad mask layer and the contact pad; and completing the integrated circuit.

17. The method as claimed in claim 16 additionally comprising:

using a tester having a microprobe; and wherein:

forming the contact pad includes forming the contact pad for contact by the microprobe.

18. The method as claimed in claim 16 additionally comprising:

forming the contact pad mask layer uses a photoresist.

19. The method as claimed in claim 16 wherein:

forming the contact pad forms a material selected from a group consisting of copper, aluminum, gold, silver, a compound thereof, and a combination thereof.

20. The method as claimed in claim 16 wherein:

removing the contact pad mask layer and the contact pad uses chemical mechanical polishing.

* * * * *